(12) United States Patent
Juengling

(10) Patent No.: US 7,902,598 B2
(45) Date of Patent: Mar. 8, 2011

(54) TWO-SIDED SURROUND ACCESS TRANSISTOR FOR A 4.5F2 DRAM CELL

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 853 days.

(21) Appl. No.: 11/166,721

(22) Filed: Jun. 24, 2005

(65) Prior Publication Data

US 2006/0289919 A1    Dec. 28, 2006

(51) Int. Cl.
H01L 29/94  (2006.01)
(52) U.S. Cl. .............. 257/331; 257/330; 257/E29.26
(58) Field of Classification Search .............. 257/301, 257/329–331, 520, E29.257, E29.26
See application file for complete search history.

(56) References Cited

U.S. PATENT DOCUMENTS

| 4,234,362 A | 11/1980 | Riseman |
| 4,419,809 A | 12/1983 | Riseman et al. |
| 4,432,132 A | 2/1984 | Kinsbron et al. |
| 4,470,062 A | 9/1984 | Muramatsu |
| 4,502,914 A | 3/1985 | Trumpp et al. |
| 4,648,937 A | 3/1987 | Ogura et al. |
| 4,776,922 A | 10/1988 | Bhattascharyya et al. |
| 4,838,991 A | 6/1989 | Cote et al. |
| 5,319,753 A | 6/1994 | MacKenna et al. |
| 5,328,810 A | 7/1994 | Lowrey et al. |
| 5,502,320 A | 3/1996 | Yamada |
| 5,514,885 A | 5/1996 | Myrick |
| 5,675,164 A | 10/1997 | Brunner et al. |
| 5,679,591 A | 10/1997 | Lin et al. |
| 5,705,321 A | 1/1998 | Brueck et al. |
| 5,821,600 A | 10/1998 | Chan |
| 5,905,285 A | 5/1999 | Gardner et al. |
| 6,004,862 A | 12/1999 | Kim et al. |
| 6,071,789 A | 6/2000 | Yang et al. |
| 6,121,148 A | 9/2000 | Bashir et al. |
| 6,229,169 B1 | 5/2001 | Hofmann et al. |
| 6,291,334 B1 | 9/2001 | Somekh |
| 6,297,554 B1 | 10/2001 | Lin |
| 6,391,782 B1 | 5/2002 | Yu |

(Continued)

FOREIGN PATENT DOCUMENTS

DE    44 08 764 A1    9/1994

(Continued)

OTHER PUBLICATIONS

Chen I. C. et al.,"A Trench Isolation Study for Deep Submicron CMOS Technology" VLSI Technology, Systems, and Applications, 1993. Proceedings of Technical Papers. 1993 International Symposium on Taipei, Taiwan May 12-14, 1993, New York, NY, USA, IEEE, US, May 12, 1993, pp. 251-255, XP010068040 ISBN: 0-7803-0978-2.

(Continued)

Primary Examiner — Matthew E Warren
(74) Attorney, Agent, or Firm — Knobbe, Martens, Olson & Bear, LLP

(57) ABSTRACT

An isolation transistor having a grounded gate is formed between a first access transistor construction and a second access transistor construction to provide isolation between the access transistor constructions of a memory device. In an embodiment, the access transistor constructions are recess access transistors. In an embodiment, the memory device is a DRAM. In another embodiment, the memory device is a 4.5F2 DRAM cell.

13 Claims, 6 Drawing Sheets

U.S. PATENT DOCUMENTS

| | | | |
|---|---|---|---|
| 6,396,113 B1* | 5/2002 | Fujinaga et al. | 257/397 |
| 6,458,662 B1 | 10/2002 | Yu | |
| 6,475,869 B1 | 11/2002 | Yu | |
| 6,548,396 B2 | 4/2003 | Naik et al. | |
| 6,551,878 B2 | 4/2003 | Clampitt et al. | |
| 6,573,030 B1 | 6/2003 | Fairbairn et al. | |
| 6,627,933 B2 | 9/2003 | Juengling | |
| 6,645,806 B2 | 11/2003 | Roberts | |
| 6,707,092 B2 | 3/2004 | Sasaki | |
| 6,709,807 B2 | 3/2004 | Hallock et al. | |
| 6,734,063 B2 | 5/2004 | Willer et al. | |
| 6,734,107 B2 | 5/2004 | Lai et al. | |
| 6,777,725 B2 | 8/2004 | Willer et al. | |
| 6,781,212 B1 | 8/2004 | Kao et al. | |
| 6,834,019 B2* | 12/2004 | Tran et al. | 365/222 |
| 6,835,988 B2 | 12/2004 | Yamashita | |
| 6,936,507 B2 | 8/2005 | Tang et al. | |
| 7,098,105 B2 | 8/2006 | Juengling | |
| 7,109,544 B2 | 9/2006 | Schloesser et al. | |
| 2002/0005590 A1 | 1/2002 | Keeth | |
| 2002/0041298 A1 | 4/2002 | Bjarnason | |
| 2002/0042198 A1 | 4/2002 | Bjarnason et al. | |
| 2002/0043690 A1 | 4/2002 | Doyle et al. | |
| 2002/0121673 A1 | 9/2002 | Jono et al. | |
| 2002/0125536 A1 | 9/2002 | Iwasa et al. | |
| 2002/0130348 A1 | 9/2002 | Tran | |
| 2002/0130686 A1 | 9/2002 | Forbes | |
| 2002/0135029 A1 | 9/2002 | Ping et al. | |
| 2002/0187356 A1 | 12/2002 | Weeks, Jr. et al. | |
| 2003/0008461 A1 | 1/2003 | Forbes et al. | |
| 2003/0040186 A1 | 2/2003 | Juengling et al. | |
| 2003/0042542 A1 | 3/2003 | Maegawa et al. | |
| 2003/0044722 A1 | 3/2003 | Hsu et al. | |
| 2003/0207207 A1 | 11/2003 | Li | |
| 2003/0218199 A1 | 11/2003 | Forbes et al. | |
| 2004/0000534 A1 | 1/2004 | Lipinski | |
| 2004/0036095 A1 | 2/2004 | Brown et al. | |
| 2004/0094786 A1* | 5/2004 | Tran et al. | 257/296 |
| 2005/0207264 A1 | 9/2005 | Hsieh et al. | |
| 2005/0277249 A1 | 12/2005 | Juengling | |
| 2006/0281250 A1* | 12/2006 | Schloesser | 438/253 |

FOREIGN PATENT DOCUMENTS

| | | | |
|---|---|---|---|
| DE | 199 28 781 C1 | 7/2000 | |
| EP | 1 202 335 A | 5/2002 | |
| JP | 11 040777 | 2/1999 | |
| WO | WO 01/01489 A1 | 1/2001 | |
| WO | WO 02/099864 A1 | 12/2002 | |
| WO | WO 2004/032246 A | 4/2004 | |
| WO | WO 2004/038807 A | 5/2004 | |
| WO | WO 2004/073044 A2 | 8/2004 | |
| WO | WO 2005/119741 A3 | 12/2005 | |

OTHER PUBLICATIONS

Kal S., "Isolation Technology in Monolithic Integrated Circuits: an overview" IETE Technical Review India, vol. 11, No. 2-3, Mar. 1994, pp. 91-103, XP001247916 ISSN: 0256-4602.

Sakao et al., *A Straight-Line-Trench Isolation and Trench-Gate Transistor (SLIT) Cell for Giga-bit DRAMs*, 3A-2, pp. 19-20, ULSI Device Development Laboratories, NEC Corporation, Sagamihara, Kanagawa 229 Japan.

Yan et al., *Scaling the Si MOSFET: From Bulk to SOI to Bulk*, IEEE Transactions of Electron Devices, vol. 39, No. 7, Jul. 1992, pp. 1704-1710.

Bergeron, et al., "Resolution Enhancement Techniques for the 90nm Technology Node and Beyond,"Future Fab International, Issue 15,4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines*," J. Vac.Sci. Technol. B21(4), Jul./Aug. 2003, pp. 1491-1495.

Chung et al., "Nanoscale Multi-Line Patterning Using Sidewall Structure," Jpn., J.App.. Phys. vol. 41 (2002) Pt. 1, No. 6B, pp. 4410-4414.

Joubert et al., Nanometer scale linewidth control during etching of polysilicon gates in high-density plasmas, Microelectronic Engineering 69 (2003), pp. 350-357.

Oehrlein et al., "Pattern transfer into low dielectric materials by high-density plasma etching," Solid State Tech., May 2000, 8 pages.

Ran-Hong Yan et al., *Scaling the Si MOSFET: From Bulk to SOI to Bulk*; IEEE Transactions on Electron Devices, vol. 39 No. 7 Jul. 1992.

Choi Y-K et al, "Nanoscale CMOS Spacer FinFET for the Terabit Era" IEEE Electron Device Letters, IEEE Inc. New York, US.

Cristoloveanu S: "Introduction to Silicon on Insulator Materials and Devices" Microelectronic Engineering, Elsevier Publishers BV., Amsterdam, NL, vol. 39, No. 1-4, Dec. 1, 1997, pp. 145-154, XP004099506 ISSN: 0167-9317 p. 147, paragraph 3, p. 149, paragraph 3.

Imai K et al: "Crystalline Quality of Silicon Layer Formed by Fipos Technology" Journal of Crystal Growth, North-Holland Publishing Co. Amsterdam, NL, vol. 63, 1983, pp. 547-553, XP000602040 ISSN: 0022-0248.

Hisamoto D. et al., "FinFET-A Self-Aligned Double-Gate MOSFET Scaleable to 20 NM" IEEE Transactions on Electron Devices, IEEE Inc. New York, US, vol. 47, No. 12, Dec. 2000 pp. 2320-2325, XP000977037 ISSN: 0018-9383 p. 2324, paragraph 3.

Eiji Takeda et al. "A New SOI Device-Delta-Structure and Characteristics" IEICE Transactions, Institute of Electronics Information and Comm. Eng. Tokyo, JP, vol. E74, No. 2, Feb. 1, 1991, pp. 360-368, XP000230407 ISSN: 0917-1673, p. 361, paragraph 7-8.

Chen I. C. et al.,"A Trench Isolation Study for Deep Submicron CMOS Technology" VLSI Technology, Systems, and Applications, 1993. Proceedings of Technical Papers. 1993 International Symposium on Taipei, Taiwan May 12-14, 1993, New York, NY, USA, IEEE, US, May 12, 1993, pp. 251-255, XP010068040 ISBN: 0-7803-0978-2.

Kal S., "Isolation Technology in Monolithic Integrated Circuits: an overview" IETE Technical Review India, vol. 11, No. 2-3, Mar. 1994, pp. 91-103, XP001247916 ISSN: 0256-4602.

\* cited by examiner

TWO-SIDED SURROUND ACCESS TRANSISTOR FOR A 4.5F2 DRAM CELL

BACKGROUND OF THE INVENTION

1. Field of the Invention

The invention relates generally to memory devices, and particularly to systems and methods of isolating access transistor constructions for DRAM devices.

2. Description of the Related Art

Access transistors, such as Field Effect Transistors (FET's) are used in memory structures such as dynamic random access memories ("DRAMs") for controlling access to capacitors used to store charge representing information contained in the memories. The access transistors need to be able to provide high impedance when they are turned OFF and a low impedance connection when they are turned ON.

DRAMs and other memories use an addressing scheme whereby a wordline that is coupled to many transistor gates is selected, and at the same time, a bitline or digit line that is coupled to many transistor drains is selected. An access transistor that is located at the intersection of the selected wordline and the selected digit line is turned ON, and that memory cell is accessed.

In DRAMs, charge leakage effects necessitate periodic refreshing of the information stored in the memory. In turn, refreshing of the DRAM leads to increased power consumption and delays in memory operation. Accordingly, it is desirable to reduce charge leakage effects in DRAMs.

One source of charge leakage is parasitic conductance. At the same time the access transistor that is located at the intersection of the selected wordline and the selected digit line is turned ON, many other access transistors have a drain voltage due to the drains of the access transistors being coupled to the selected digit line. These access transistors exhibit some parasitic conductance as a result of the drain voltage.

Additionally, it is desirable to minimize the area required for memories, such as DRAMs. The need for increasingly smaller semiconductors results in adjacent transistors placed closer together on the semiconductor wafer. This, in turn, results in the depletion regions of the transistors placed closer together, while still requiring electrical isolation of various circuit elements from one another. One method to create smaller depletion regions around transistors is to increase the substrate doping concentrations. However, higher doping levels increase the contaminant level in the silicon, which in turn, increases the leakage current of the transistor.

In another method to maintain electrical isolation of various circuit elements from each other, electrical isolation structures are fabricated in the semiconductors. However, electrical isolation structures require space on the DRAM or other integrated circuitry. Various techniques have been developed to reduce the area used for electrical isolation structures. As illustrated in FIG. 1, one technique for providing electrical isolation while requiring relatively little space is to place an isolation trench 102 between a portions of transistor constructions 100. However, in some types of integrated circuits, a portion of the parasitic conductance is due to corner effects that are an artifact of using trench isolation techniques.

FIG. 1 also illustrates the depletion regions 104 surrounding the gate construction of each transistor construction 100. The isolation trench 102 does not have a surrounding depletion region.

SUMMARY OF THE INVENTION

A transistor with a grounded gate or an isolation transistor is constructed between a first access transistor construction and a second access transistor construction to provide isolation between the access transistor constructions of a memory device. In an embodiment, the memory device is a DRAM. In another embodiment, the memory device is a 4.5F2 DRAM cell. In an embodiment, the access transistor constructions are two-sided surround access transistors.

The isolation transistor between access transistor constructions creates a depletion region under the gate of the isolation transistor, such that the electrons in the substrate move away from the gate. This pinches off and merges the depletion region of the isolation transistor with the depletion regions of the adjacent access transistor constructions. Leakage current is substantially reduced, as there is no place for the electrons in the merged depletion region. The depletion regions may be placed close together to produce a smaller semiconductor. Further, a lower doping concentration of the silicon substrate may also be used.

One embodiment of this invention is a memory device comprising a semiconductor substrate, a plurality of charge storage devices associated with the semiconductor substrate, a plurality of digit lines associated with the semiconductor substrate, a plurality of gates electrically interposed between a charge storage device and a digit line wherein a gate, a charge storage device and a digit line define a memory cell, wherein the gates are formed so as to be recessed into the semiconductor substrate such that a first depletion region is formed within the semiconductor substrate and such that, when the gate is activated, a conductive path is formed about the perimeter of the recessed gate within the semiconductor substrate to thereby allow charge to flow between the charge storage device and the corresponding digit line, and a plurality of isolation structures formed so as to be recessed within the semiconductor substrate and so as to define a second depletion region within the semiconductor substrate.

Another embodiment of the invention is a memory device comprising a substrate having a first surface, a plurality of memory cells arranged in a pattern on the substrate, wherein the plurality of memory cells include a charge storage device and a recessed access device formed so as to extend into the substrate, wherein the recess access device induce a depletion region in the substrate and further defines a current flow path about the recessed perimeter of the recess access device within the substrate, and a plurality of isolation structures formed in the substrate, so as to isolate the plurality of memory cells from each other wherein the plurality of isolation structures comprised recessed access devices that are formed so as to extend into the substrate, wherein the plurality of isolation structures induce a second depletion region in the substrate.

Another embodiment of the invention is a memory device comprising a substrate having a first surface; a first memory construction comprising a first memory storage device, a first digit line; and a first transistor construction having a first recessed gate that extends into the substrate from the first surface, a first source, and a first drain, wherein the first memory storage device is electrically coupled to the first source, and the first digit line is electrically coupled to the first drain; a second memory construction comprising a second memory storage device, a second digit line; and a second transistor construction having a second recessed gate, a second source, and a second drain, wherein the second memory storage device is electrically coupled to the second source, and the second digit line is electrically coupled to the second drain; wherein the first and second transistor constructions are recess access devices; and a grounded recessed transistor gate construction interposed between the first and second memory constructions.

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements. In addition, the first digit of each reference number indicates the figure in which the element first appears.

DETAILED DESCRIPTION OF THE PREFERRED EMBODIMENT

Figure 1:
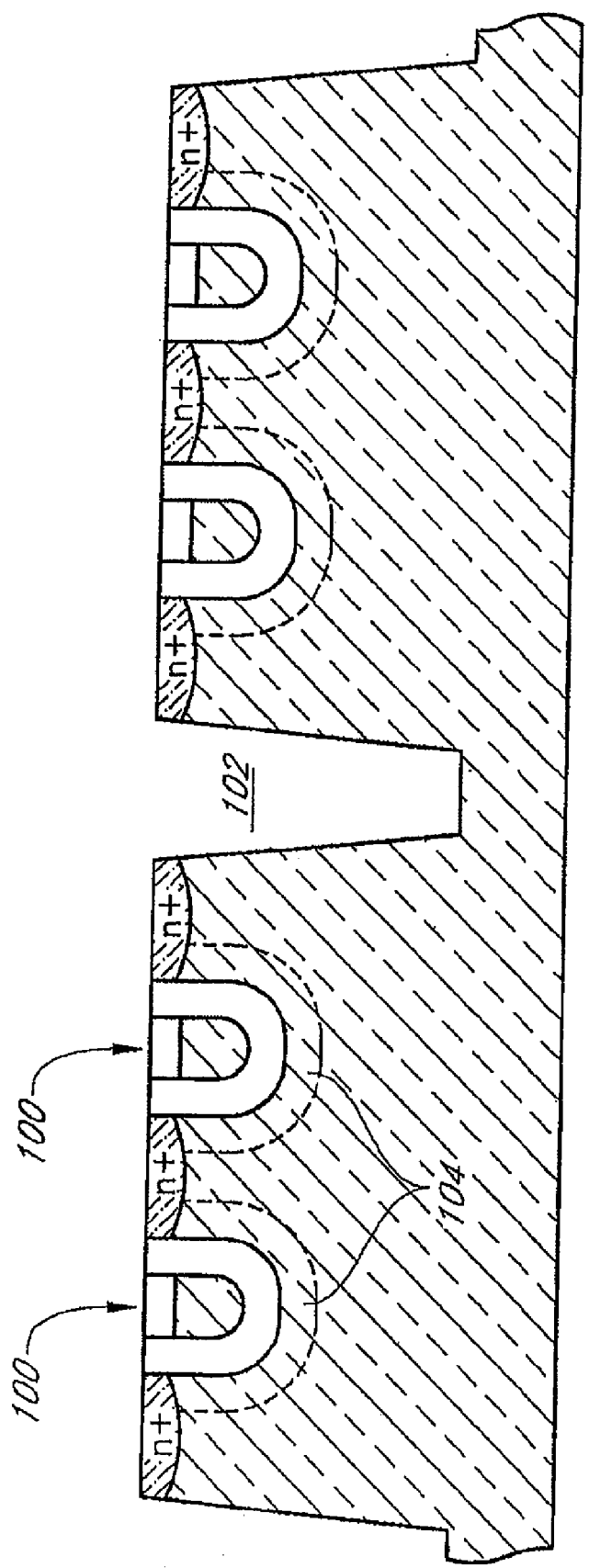
FIG. 1 illustrates a simplified side view of trench isolation structures and transistor constructions.
Figure 2:
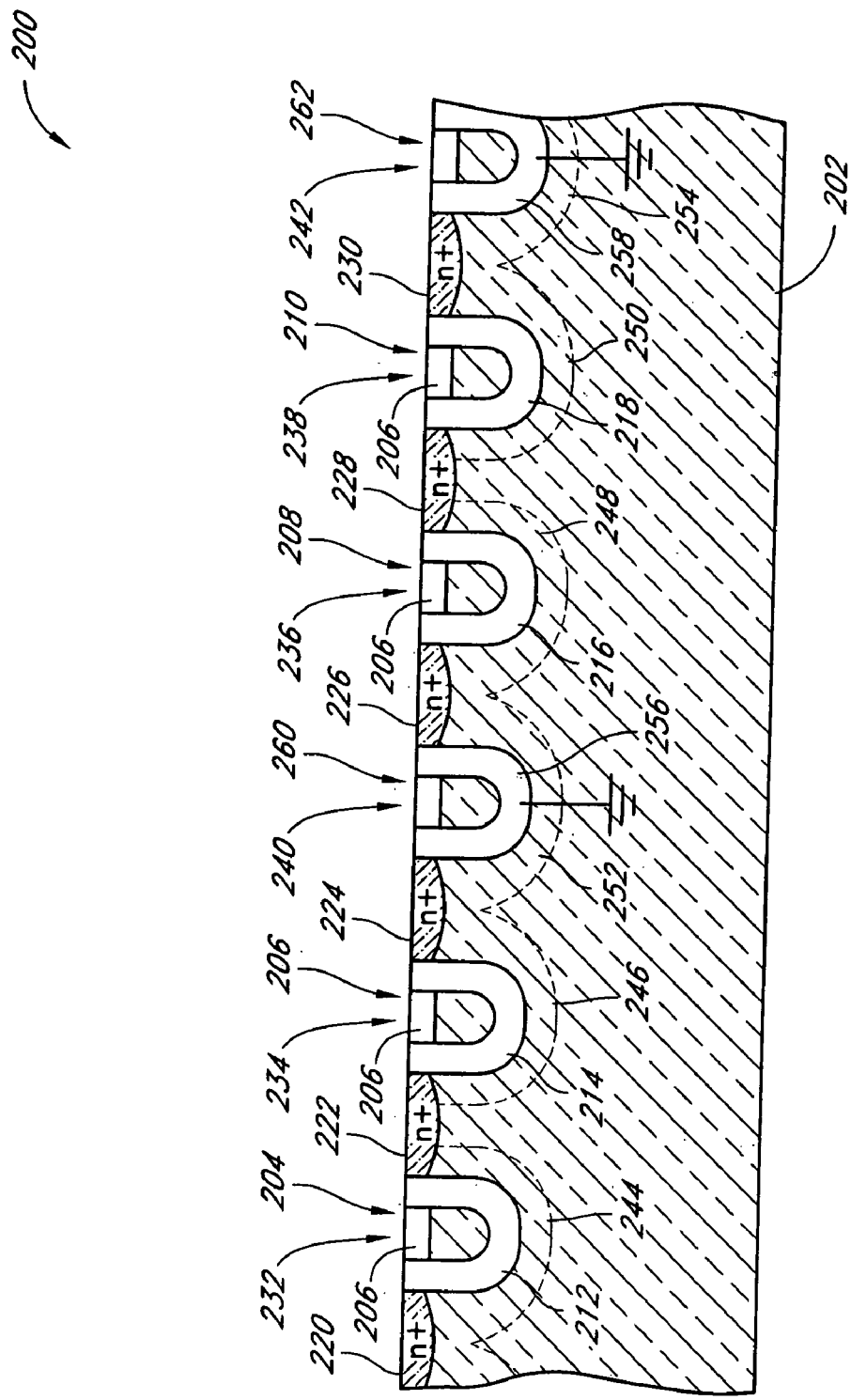
FIG. 2 illustrates a simplified side view of transistor isolation constructions and access transistor constructions of an embodiment of the invention.

For a more detailed understanding of the invention, reference is first made to FIG. 2. FIG. 2 illustrates a simplified side view of a portion of a memory device 200 comprising transistor isolation constructions and access transistor constructions of an embodiment of the invention.

The memory device 200 comprises a semiconductor substrate 202, which may comprise a wide variety of suitable materials. The semiconductor substrate 202 may include semiconductor structures and/or other layers that have been fabricated thereon or any doped silicon platform that is commonly used in the art. While the illustrated semiconductor substrate 202 comprises an intrinsically doped monocrystalline silicon wafer, those of ordinary skill in the art will understand that the semiconductor substrate 202 in other arrangements can comprise other forms of semiconductor layers, which include other active or operable portions of semiconductor devices.

The memory device 200 further comprises transistor gate constructions 204-210, 240, 242. Transistor gate constructions 204-210, 240, 242 are shown formed within the semiconductor substrate 202. In another embodiment, the transistor gate constructions 204-210, 240, 242 are formed on the substrate 202.

Transistor gate constructions 204-210, 240, 242 comprise a gate dielectric 212-218, 256, 258, respectively, a silicon layer (not shown), a conductive layer (not shown), and an insulative cap 206. In an embodiment, the gate dielectric 212-218, 256, 258 comprises an oxide, such as, for example silicon dioxide. In an embodiment, the silicon layer comprises conductively doped silicon. In an embodiment, the conductive layer comprises a metal or a metal silicide, such as, for example, copper, gold, aluminum, tungsten silicide, titanium silicide, cobalt silicide, or nickel silicide. In an embodiment, the insulative cap 206 comprises an insulator, such as, for example, silicon dioxide, or silicon nitride.

It is to be understood that the layers of the transistor gate constructions 204-210, 240, 242 are exemplary layers, and that other layers can be used in addition to, or alternatively to, the described layers. For example, a barrier layer can be incorporated between the conductive layer and the silicon layer.

The memory device 200 further comprises doped diffusion regions or source/drain regions 220-230 formed within the substrate 202. Source/drain regions 220 and 222, along with transistor gate construction 204 define a first transistor construction 232. Source/drain regions 222 and 224, along with transistor gate construction 206 define a second transistor construction 234.

Source/drain region 222 is gatedly connected to source/drain regions 220 and 224 through transistor gates 212 and 214, respectively. Source/drain region 222 can be considered to be a shared source/drain region, in that it is shared by the first transistor construction 232 and the second transistor construction 234.

Similarly, source/drain regions 226 and 228, along with transistor gate construction 208 define a third transistor construction 236. Source/drain regions 228 and 230, along with transistor gate construction 210 define a fourth transistor construction 238.

Source/drain region 228 is gatedly connected to source/drain regions 226 and 230 through transistor gates 216 and 218, respectively. Source/drain region 228 can also be considered to be a shared source/drain region, in that it is shared by the third transistor construction 236 and the fourth transistor construction 238.

In an embodiment, the gate dielectrics 212-218, 256, 258 are wordlines 212-218, 256, 258, respectively. In an embodiment, the transistor constructions 232-238 are two-sided surround access transistors. In another embodiment, the transistor constructions 232-238 are recess access transistors. In a further embodiment, the transistor constructions 232-238 are U-gate transistors. In a further embodiment, the transistor constructions 232-238 are recess access devices. In a further embodiment, the transistor constructions 232-238 are recess access device (RAD) access transistors.

In an embodiment, the transistor constructions 232-238 are NMOS transistor devices, such that the source/drain regions 220-230 comprise n-type regions. In another embodiment, the transistor constructions 232-238 are PMOS transistor devices, such that the source/drain regions 220-230 comprise p-type regions. The memory device 200 can be doped using any suitable doping process, such as, for example, ion implantation, or diffusion.

The transistor gate constructions 240, 242, comprise wordlines 256, 258, respectively, as described above. To provide isolation for transistor constructions 232-238, the wordlines 256, 258 of transistor gate constructions 240, 242, respectively, are electrically connected to ground. Transistor constructions 240, 242 having grounded wordlines 256, 258, comprise isolation transistor constructions 260, 262, respectively.

In an embodiment, the substrate 202 is p-doped. The p-doped substrate 202 includes an excess of holes or positively charged particles. The grounded wordlines 256, 258 push some of the holes away from the region surrounding the wordlines 256, 258. This reduces the free holes and electrons in the region surrounding the grounded gates 256, 258 and, thus, reduces the leakage current in the region surrounding the grounded wordlines 256, 258.

The dashed lines, shown in FIG. 2, represent the boundary of a depletion region around each transistor construction 232-238 and isolation transistor constructions 260, 262. Transistor gate constructions 204-210 comprise depletion regions 244-250, respectively, and isolation transistor constructions 240, 242 comprise depletion regions 252, 254, respectively.

To provide isolation between the source and drain 224, 226 of the isolation transistor construction 260, in an embodiment, the gate voltage is approximately less or equal to the threshold voltage. In this embodiment, the isolation transistor construction 260 is in depletion mode.

In another embodiment, the gate voltage is much less than the threshold voltage, which also provides isolation between the source and drain 224, 226, of the isolation transistor construction 260. In this embodiment, the isolation transistor construction 260 is in accumulation mode.

As shown in FIG. 2, the depletion region 252 of grounded gate 256 merges with the depletion regions 246, 248, of the transistor constructions 234, 236. This provides isolation between the transistor constructions 234 and 236. In one implementation, the gates 256 are grounded. In another implementation a negative voltage, e.g., of approximately −0.5V is applied to enhance the depletion region. The depletion regions surrounding the grounded wordlines of the isolation transistor constructions merge with the depletion regions of the adjacent active transistor constructions in the memory device 200 to provide isolation. Leakage current is substantially reduced as there is no place for the electrons in the pinched off depletion regions 244-254.

As mentioned above, increasing the substrate doping concentrations is one method to reduce the size of the depletion region surrounding the transistor gate, thus allowing smaller spacing between transistors. In an embodiment of a memory device without isolation transistor constructions 260, 262, a doping concentration of approximately $10^{16}$ atoms/cm$^3$ to approximately $10^{20}$ atoms/cm$^3$ may be used.

Forming isolation transistor constructions 260, 262 in the memory device 200 provides isolation between active transistor elements and permits closer spacing of the access transistors 232-238 without the need for a high doping concentration in the substrate 202. Thus, a lower doping concentration of the silicon substrate 202 may be used. In an embodiment of the memory device 200, with the isolation transistor constructions 260, 262, a doping concentration of between approximately $10^{16}$ atoms/cm$^3$ to approximately $10^{15}$ atoms/cm$^3$, and preferably approximately $10^{15}$ atoms/cm$^3$ may be used.

Figure 3:
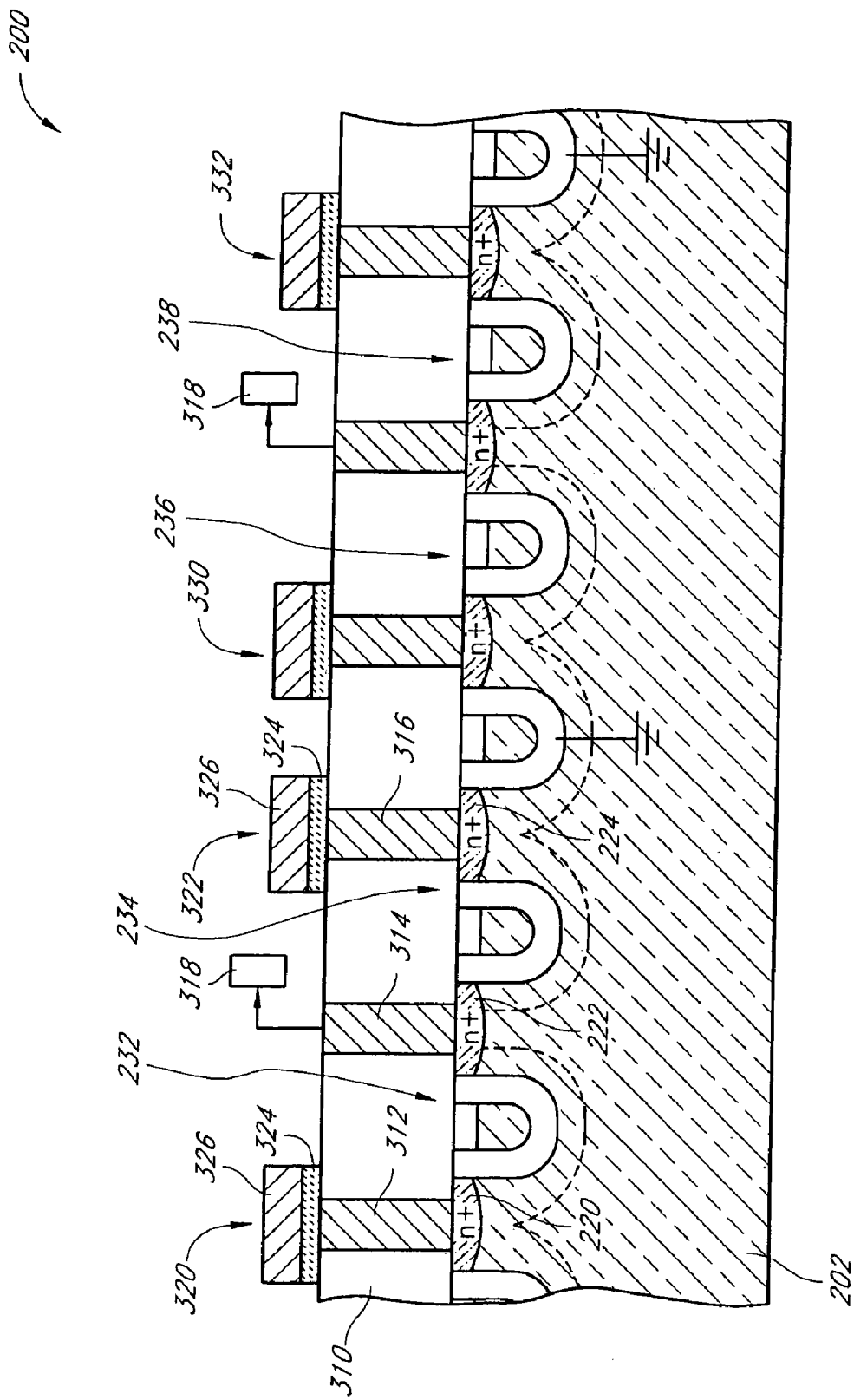
FIG. 3 illustrates simplified side view of an embodiment of the memory device 200 of FIG. 2 further comprising memory storage devices and memory access devices.

FIG. 3 is a simplified side view of an embodiment of the memory device 200 of FIG. 2 further comprising memory storage devices and memory access devices.

Referring to FIG. 3, an insulative material 310 is formed over the substrate 202, and conductive interconnects 312, 314 and 316 extend through the insulative material 310 to the source/drain regions 220, 222, and 224, respectively. Insulative material 310 can comprise, for example, borophosphosilicate glass (BPSG), and conductive interconnects 312, 314, 316 can comprise, for example, one or more of conductively-doped silicon, metal silicide, or elemental metal.

Conductive interconnect 314 is electrically connected with a digit line 318, which results in an electrical connection between shared source/drain region 222 and the digit line 318. Electrical connections 312 and 316 are incorporated into capacitor constructions 320 and 322, respectively. In an embodiment, a dielectric material 324 is formed over electrical connections 312 and 316, and a capacitor plate 326 is subsequently formed over the dielectric material 324. Accordingly, conductive interconnects 312 and 316 are incorporated into capacitor constructions 320 and 322 as storage nodes. Dielectric material 324 can comprise, for example, one or more of silicon dioxide, silicon nitride, or so-called high K dielectric materials, such as tantalum pentoxide. Capacitor plates 326 can comprise, for example, one or more of conductively-doped silicon, metal, or metal silicide.

Transistor constructions 232-238 define access transistors for the memory device 200. Transistor constructions 232 and 234 are utilized to provide access between the digit line 318 and the capacitor constructions 320 and 322, while transistor constructions 236 and 238 are utilized to provide access between the digit line 318 and capacitor constructions 330 and 332.

Figure 4:
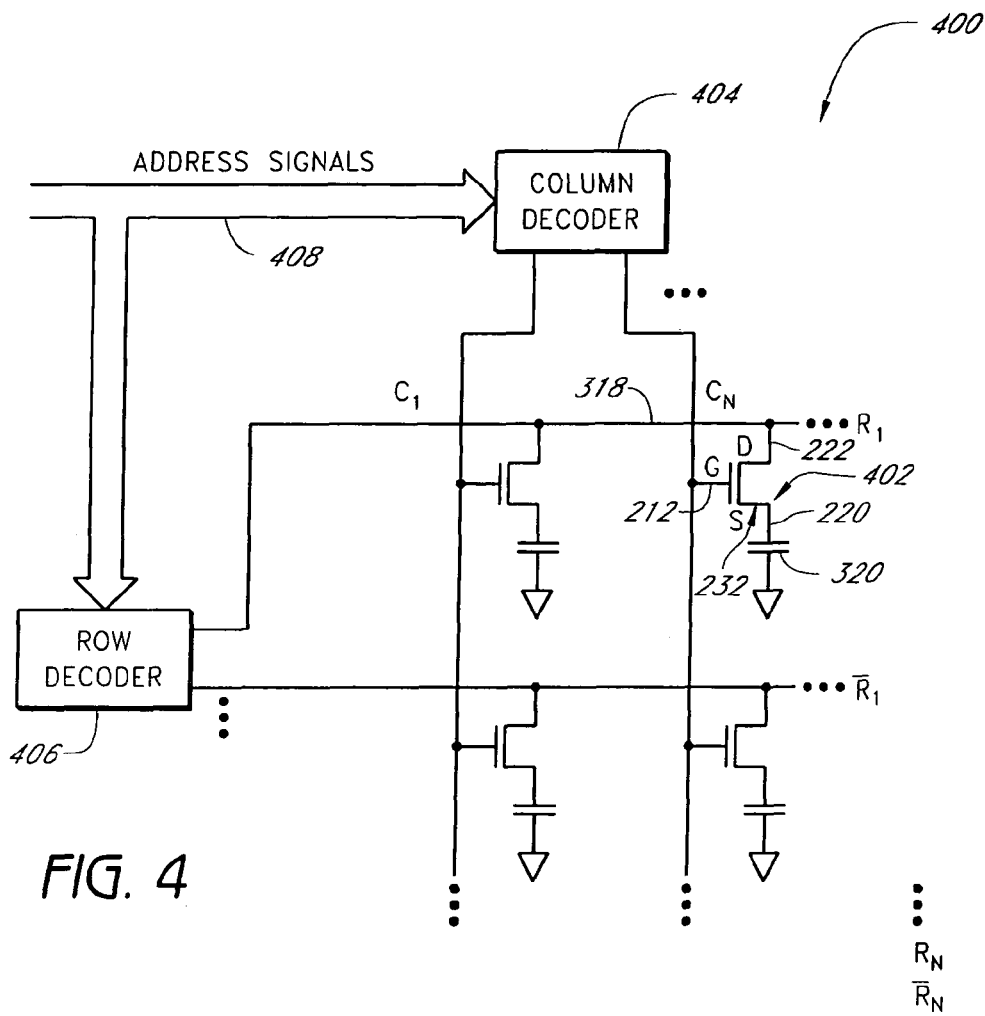
FIG. 4 is a circuit diagram of a memory array containing multiple wordlines and digit lines, where the memory array comprises the structures of FIGS. 2 and 3, according to an embodiment of the invention.

FIG. 4 is a circuit diagram of a memory array 400 comprising a plurality of wordlines, digit lines, and memory cells 402. In an embodiment, the memory array 400 comprises the structures of FIGS. 2 and 3.

The memory cells 402 are organized into columns $C_1$-$C_N$ and rows $R_1$-$R_N$. A column decoder 404 and a row decoder 406 process address signals 408 to identify the column $C_N$ and row $R_N$ of the targeted memory cell 402. The columns are commonly known as wordlines and the rows are typically known as digit lines or bitlines.

The exemplary memory cell 402 comprises the transistor 232, the capacitor 320 coupled to the source S, 220 of the transistor 232, the wordline 212 coupled to the gate G of the transistor 232 and to other gates in other memory cells, and the digit line 318 coupled to the drain D, 222, of the transistor 232 and to other drains in other memory cells. In an embodiment, the gate G of transistor 232 comprises the wordline 212.

By selecting the wordline 212 and the bitline 318, the transistor 232 is turned ON, and the charge stored in the capacitor 320 can be measured to determine the datum stored in the memory cell 402. Alternatively, by selecting and turning ON the transistor 232, a charge can be injected into the capacitor 320, to write a datum therein, and the transistor 232 can be turned OFF to store the datum in the memory cell 402.

Figure 5:
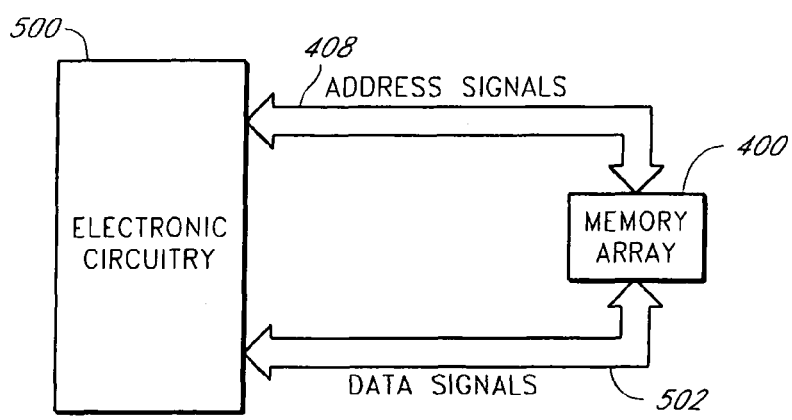
FIG. 5 is a schematic diagram depicting communication between electronic circuitry and a memory device, where the memory device comprises the structures of FIGS. 2 and 3, according to an embodiment of the invention.

FIG. 5 illustrates the memory array 400 interfacing with electronic circuitry 500 via conventional address signals 408 and data signals 502. The address signals 408 select one or more memory cells 402 in the memory array 400. The data signals 502, on the other hand, carry data that is stored in or retrieved from the memory cells 402 in the memory array 400.

In one embodiment, the memory array 400 is a dynamic random access memory (DRAM). In other embodiments the memory array 400 may comprise a wide variety of memory devices such as static memory, dynamic memory, extended data out memory, extended data out dynamic random access memory (EDO DRAM), synchronous dynamic random access memory (SDRAM), double data rate synchronous dynamic random access memory (DDR SDRAM), synchronous link dynamic random access memory (SLDRAM), video random access memory (VRAM), rambus dynamic random access memory (RDRAM), static random access memory (SRAM), flash memories, or any other memory type known in the art.

The memory array 400 interfaces with different types of electronic circuitry 500. By way of example, the electronic circuitry 500 can include any device, which accesses or relies on memory including, but not limited to, computers, and the like.

The computers comprise, by way of example, processors, program logic, or other substrate configurations representing data and instructions, which operate as described herein. In other embodiments, the processors can comprise controller circuitry, processor circuitry, processors, general purpose single-chip or multi-chip microprocessors, digital signal processors, embedded microprocessors, microcontrollers, and the like.

In some embodiments, the memory array 400 and the electronic circuitry 500 are implemented separately. In other embodiments, the memory array 400 and the electronic circuitry 500 are integrated together. Furthermore, one of ordinary skill in the art will recognize that the memory array 400 can be implemented in a wide variety of devices, products, and systems.

Figure 6A:
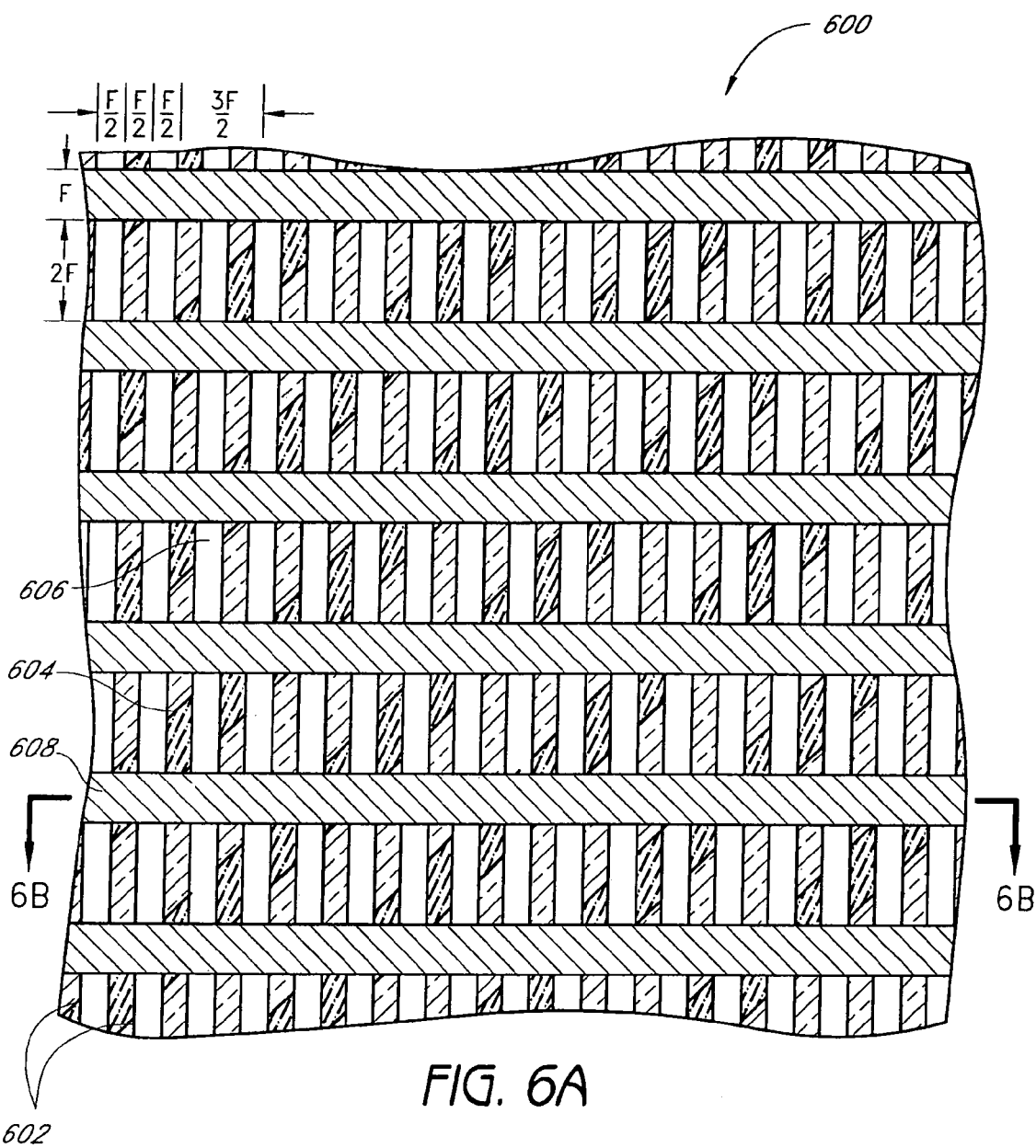
FIG. 6A is a top view of a memory storage device 600, according to an embodiment of the invention.

FIG. 6A is a top view of an embodiment of a memory storage device or memory array 600. The memory array 600 comprises a plurality of wordlines 602, a plurality of digit lines 608, a plurality of isolation transistor constructions 606, and a plurality of active areas 604. The active areas 604 are tilted with respect to the digit lines, (i.e. the x-axis). In an embodiment, layouts of the active areas 604 are at 45°. In other embodiments, the active areas 604 make an angle with respect to the x-axis, where the angle is between approximately 0° to approximately 180°. In an embodiment, the pitch of the memory cells in the memory array 600 is 3F for one cell in the Y direction, and 3F for two cells in the X direction.

Figure 6B:
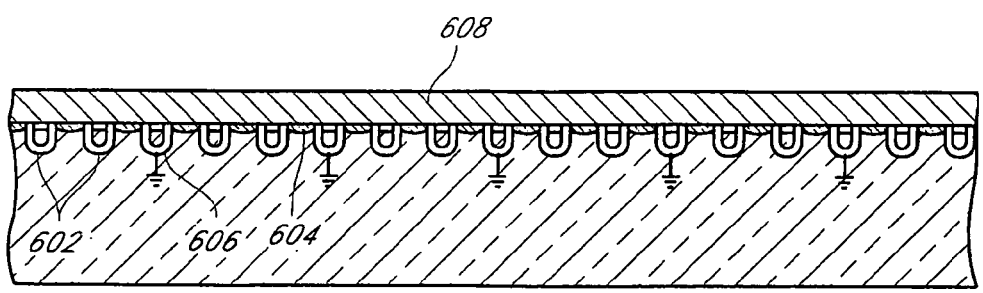
FIG. 6B is a simplified side view of an embodiment of the memory storage illustrated in FIG. 6A.

FIG. 6B is a simplified side view of an embodiment of the memory array 600 illustrated in FIG. 6A. FIG. 6B further illustrates the plurality of wordlines 602, the plurality of digit lines 608, the plurality of isolation transistor constructions 606, and the plurality of active areas 604, shown in FIG. 6A.

Figure 7A:
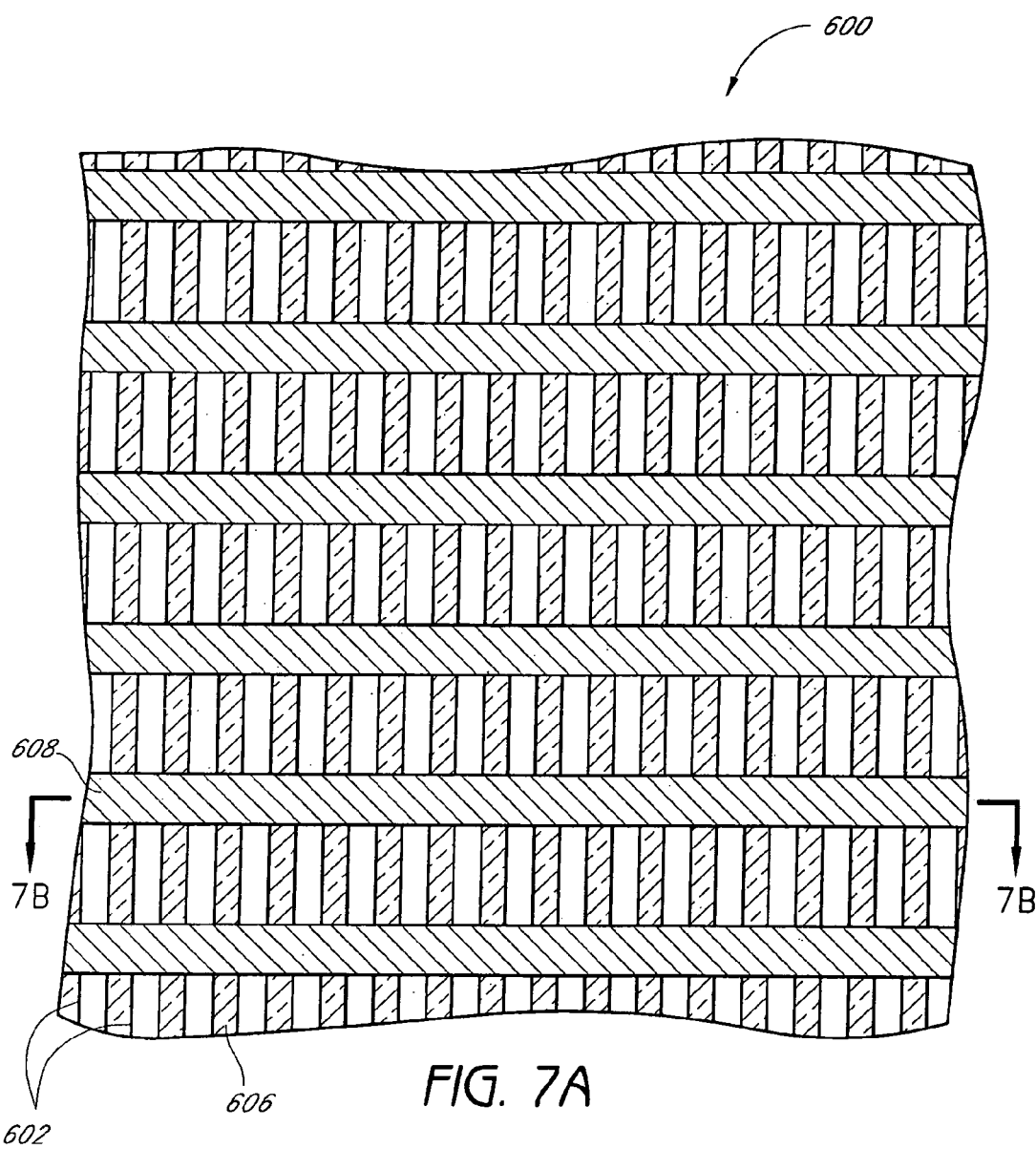
FIG. 7A is a top view of a memory storage device, according to another embodiment of the invention.

FIG. 7A is a top view of another embodiment of the memory array 600. In the embodiment illustrated in FIG. 7A, the layouts of the active areas 604 are at 0°. The active areas 604 are below and covered by the digit lines 608.

Figure 7B:
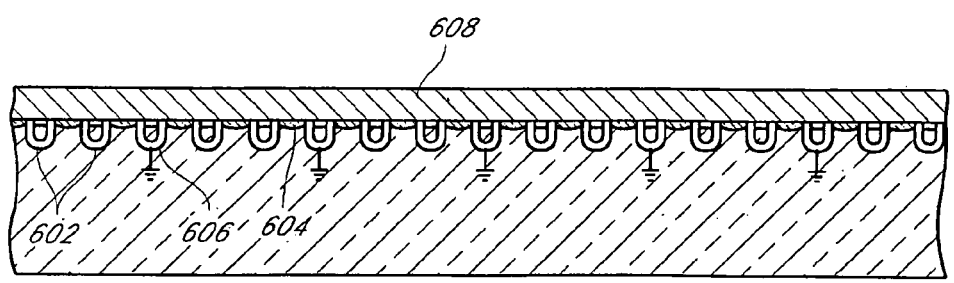
FIG. 7B is a simplified side view of an embodiment of the memory storage illustrated in FIG. 7A.

FIG. 7B is a simplified side view of an embodiment of the memory storage illustrated in FIG. 7A. FIG. 7B illustrates the plurality of active areas 604, and further illustrates the plurality of wordlines 602, the plurality of digit lines 608, and the plurality of isolation transistor constructions 606 shown in FIG. 7A.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising;
a semiconductor substrate;
a plurality of charge storage devices coupled with the semiconductor substrate;
a plurality of digit lines coupled with the semiconductor substrate;
a plurality of gates each electrically interposed between a charge storage device and a digit line wherein a gate, a charge storage device and a digit line define a memory cell, wherein each of the gates is formed so as to be recessed into the semiconductor substrate such that a first depletion region is formed within the semiconductor substrate and such that, when the gate is activated, a conductive path is formed about the perimeter of the recessed gate within the semiconductor substrate to thereby allow charge to flow between the charge storage device and the corresponding digit line;
a plurality of isolation structures each formed so as to be recessed within the semiconductor substrate so as to isolate adjacent memory cells and so as to define a second depletion region for each of the isolation structures within the semiconductor substrate, wherein the plurality of isolation structures are biased such that the second depletion region merges with the corresponding first depletion region to isolate adjacent cells from each other.

2. The device of claim 1, wherein the plurality of isolation structures are biased so as to define the second depletion region.

3. The device of claim 2, wherein the plurality of isolation structures are grounded.

4. The device of claim 2, wherein the plurality of isolation structures are biased such that the second depletion region merges with the corresponding first depletion region such that the doping level of the semiconductor substrate can be reduced without increasing the leakage current between memory cells.

5. The device of claim 1, wherein each of the plurality of cells comprise a first and a second plurality of recessed gates and a first and a second charge storage device and wherein each of the plurality of cells include a common source/drain region that is common between the first and second gates and is electrically coupled to a single digit line.

6. The device of claim 5, further comprising a plurality of source/drain regions that are electrically coupled to the charge storage device.

7. The device of claim 1, wherein the substrate comprises a p-doped substrate and wherein the plurality of recessed gates comprise recessed access devices.

8. The device of claim 1, further comprising a word line that is used to activate the gate of a plurality of cells and wherein the bit line also electrically connects to a plurality of cells and wherein the gate of each cell defines an active area and wherein the active area of each cell is oriented at an angle of 45 degrees with respect to the bit line and word line.

9. The device of claim 1, further comprising a word line that is used to activate the gate of a plurality of cells and wherein the bit line also electrically connects to a plurality of cells and wherein the gate of each cell defines an active area and wherein the active area of each cell is oriented at an angle of 0 degrees with respect to the bit line.

10. The memory device of claim 1 wherein the isolation structure is biased so as not to electrically conduct.

11. The memory device of claim 10 wherein the isolation structure is biased such that the isolation structure is in the depletion mode.

12. The memory device of claim 10 wherein the isolation structure is biased such that the isolation structure is in the accumulation mode.

13. The memory device of claim 1 wherein the isolation structure comprises a grounded recessed gate.

* * * * *